United States Patent [19]
Tostado et al.

[11] Patent Number: 5,877,551
[45] Date of Patent: Mar. 2, 1999

[54] SEMICONDUCTOR PACKAGE HAVING A GROUND OR POWER RING AND A METAL SUBSTRATE

[75] Inventors: Salvador A. Tostado, Elk Grove; George A. Brathwaite, Union City; Paul R. Hoffman, Modesto; George A. Erfe, San Diego; Serafin P. Pedron, Jr., Manteca; Michael A. Raftery, Livermore; Kambhampati Ramakrishna, Manteca; German J. Ramirez, Antioch; Linda E. Strauman, Oakdale, all of Calif.

[73] Assignee: Olin Corporation, Manteca, Calif.

[21] Appl. No.: 752,193

[22] Filed: Nov. 18, 1996

Related U.S. Application Data

[60] Provisional application No. 60/007,451 Nov. 22, 1995.

[51] Int. Cl.$^6$ .......................... H01L 23/053; H01L 23/14; H01L 23/04
[52] U.S. Cl. .......................... 257/701; 257/711; 257/702; 257/730; 438/121; 438/125
[58] Field of Search ..................... 257/701, 698, 257/678, 703, 707, 711, 689, 702, 730, 734, 668; 438/121, 125

[56] References Cited

U.S. PATENT DOCUMENTS

| | | | |
|---|---|---|---|
| 4,040,083 | 8/1977 | Saiki et al. | 257/643 |
| 4,447,824 | 5/1984 | Logan et al. | 257/750 |
| 4,508,749 | 4/1985 | Brannon et al. | 257/759 |
| 4,712,062 | 12/1987 | Takamine | 324/754 |
| 4,839,717 | 6/1989 | Phy et al. | 257/700 |
| 4,894,115 | 1/1990 | Eichelberger et al. | 219/121.69 |
| 4,915,981 | 4/1990 | Traskos et al. | 219/121.7 |
| 4,940,881 | 7/1990 | Sheets | 219/121.69 |
| 5,091,768 | 2/1992 | Yamazaki | 257/758 |
| 5,108,553 | 4/1992 | Foster et al. | 29/852 |
| 5,194,713 | 3/1993 | Egitto et al. | 219/121.71 |
| 5,231,751 | 8/1993 | Sachdev et al. | 29/852 |
| 5,245,751 | 9/1993 | Locke et al. | 29/852 |
| 5,315,147 | 5/1994 | Solomon | 257/448 |
| 5,374,176 | 12/1994 | Jang | 425/116 |
| 5,386,430 | 1/1995 | Yamagishi et al. | 372/57 |
| 5,397,863 | 3/1995 | Afzali-Ardakani et al. | 174/258 |
| 5,438,478 | 8/1995 | Kondo et al. | 257/698 |
| 5,457,057 | 10/1995 | Nath et al. | 437/2 |
| 5,457,340 | 10/1995 | Templeton, Jr. et al. | 257/666 |
| 5,504,372 | 4/1996 | Braden et al. | 257/706 |
| 5,561,323 | 10/1996 | Andros et al. | 257/707 |

Primary Examiner—Mahshid D. Saadat
Assistant Examiner—Jhihan B. Clark
Attorney, Agent, or Firm—Gregory S. Rosenblatt; Wiggin & Dana

[57] ABSTRACT

A semiconductor package is provided that has a rigid metal substrate and a dielectric layer covering a first portion of the rigid metal substrate, with a second portion of the rigid metal substrate being substantially free of the dielectric layer. A semiconductor device is electrically bonded to the second portion of the rigid metal substrate and metal circuit traces defining electrical paths are formed on the dielectric layer, at least one of which contacts the rigid metal substrate through at least one via in the dielectric layer. Additionally, a method is provided for grounding a semiconductor device and at least one circuit trace on a rigid metal substrate substantially covered by a dielectric layer, which includes creating at least one via in the dielectric layer using a laser and creating circuit traces on the dielectric layer, at least one of which contacts the rigid metal substrate through at least one of the vias. The semiconductor is electrically bonded to the rigid metal substrate in an aperture in the dielectric layer.

9 Claims, 2 Drawing Sheets

SEMICONDUCTOR PACKAGE HAVING A GROUND OR POWER RING AND A METAL SUBSTRATE

CROSS REFERENCE TO RELATED APPLICATION

This patent application is a continuation in part and claims priority in part to U.S. Provisional Patent Application Ser. No. 60/007,451 entitled "Semiconductor Package Having a Ground or Power Ring and a Metal Substrate" by Brathwaite et al. that was filed on Nov. 22, 1995.

BACKGROUND OF THE INVENTION

1. Field of the Invention

The present invention relates generally to the design and fabrication of packages for semiconductor devices. More particularly, this invention relates to a semiconductor package having a metal ring connected to a rigid metal substrate.

2. Description of Related Art

Recent advances in the design and fabrication of silicon devices provide for gate delays as low as a fraction of a nanosecond, producing operating frequencies in the gigahertz range. The packaging of such devices, however, promises to be problematic. Although packaging is only a part of the overall chip to chip communication system, signal degradation at the package level frequently accounts for a disproportionate share of the degradation in the overall system.

Signal degradation can arise from a variety of factors, including (1) variations in signal line impedance, causing signal reflections which are a major sources of noise; (2) resistive losses in the internal package transmission lines, causing signal attenuation; (3) capacitive coupling between adjacent signal transmission lines, causing crosstalk which is another major source of noise; (4) inductive coupling, particularly in the power and ground connections, causing wave form degradation and crosstalk between the various signals; (5) switching noise, an inductive voltage spike that occurs on a conductive path as the result of a rapid current switching in the conductive path or nearby paths; and (6) crosstalk, the undesirable appearance of a voltage spike in a conductive path as a result of mutual capacitance and inductance between the conductive path and other nearby conductive paths.

Previously, ground and power planes have been used in integrated circuit packages in an attempt to provide uniform ground and power supplies to the integrated circuit and to reduce electrical noise. Such power and ground planes have been disclosed, for example, in U.S. Pat. No. 5,457,340 to Templeton, Jr. et al. issued Oct. 10, 1995.

The Templeton patent discloses a leadframe having a plurality of electrically conductive leads and an electrically conductive ring or ring segments formed on the leadframe around the circumference of the die attach pad between the die attach pad and leads. The power and ground planes in Templeton are formed as part of the leadframe.

Another type of ground plane is disclosed in U.S. Pat. No. 5,438,478 to Kondo et al. issued Aug. 1, 1995. The Kondo patent discloses a metal heat spreader attached to a semiconductor device partially enclosed in a molding resin. The metallic heat spreader may be connected to either power or ground. The Kondo patent discloses that the heat spreader covers the chip and only a small portion of the inner leadframe.

Still another type of ground plane is disclosed in U.S. Pat. No. 4,839,717 to Phy et al. issued Jun. 13, 1989. The Phy patent discloses a ceramic package having a ground ring surrounding the chip, but not over it, and covering the inner leadframe. The Phy patent also discloses a ground ring on the periphery of the chip which is connected to the ground ring surrounding the chip on the ceramic package.

The above-described ground planes suffer from the disadvantage that they fail to provide reduced noise capability on those portions of the leadframe not covered by the ground ring. Therefore, a package design is needed which substantially reduces noise and cross-talk in the circuits for not just the leads near the chip, but the areas surrounding the chip as well.

Furthermore, semiconductor packages are needed which minimize some or all of the degradative factors listed above. In particular, it would be desirable to provide a package which minimizes variations in signal transmission line impedance, minimizes resistive losses in the signal transmission lines, reduces capacitive coupling between adjacent signal transmission lines and reduces inductive coupling in the power and/or ground connections.

SUMMARY OF THE INVENTION

In accordance with the invention, a semiconductor package is described that includes a rigid metal substrate and a dielectric layer covering a first portion of the rigid metal substrate and a second portion of the rigid metal substrate being substantially free of the dielectric layer. A semiconductor device is electrically bonded to the second portion of the rigid metal substrate and metal circuit traces defining electrical paths are formed on the dielectric layer, at least one of which contacts the rigid metal substrate through at least one via in the dielectric layer. Also, in accordance with the invention, the rigid metal substrate is connected to ground or power.

Further, in accordance with the invention a method is provided for grounding a semiconductor device and at least one circuit trace on a rigid metal substrate substantially covered by a dielectric layer by creating at least one via in the dielectric layer using a laser and creating circuit traces on the dielectric layer, at least one of which contacts the rigid metal substrate through at least one of the vias. The semiconductor device is then bonded to the rigid metal substrate in an aperture in the dielectric layer. Further, in accordance with the invention, the metal substrate is aluminum. Still further in accordance with the invention, the dielectric layer is aluminum oxide or an aluminum oxide and a polymer, for example, an epoxy. Still further in accordance with the invention, instead of a laser, vias may be made by an appropriate mask and subsequent etching or by an appropriate mask and subsequent anodization.

The accompanying drawings, which are incorporated in and constitute a portion of this specification illustrate an embodiment of the invention and together with the detailed description serve to explain the objects, advantages and principles of the invention.

DETAILED DESCRIPTION

A semiconductor package according to the present invention includes a rigid metal substrate; a dielectric layer covering a first portion of the metal substrate; a semiconductor device bonded to a second portion of the rigid metal substrate substantially free of the dielectric layer and metal circuit traces defining electrical paths on the dielectric layer, at least one of which contacts the rigid metal substrate through at least one via in the dielectric layer.

Reference will now be made in detail to the present preferred embodiment of the invention, an example of which is illustrated in the accompanying drawings.

Figure 1:
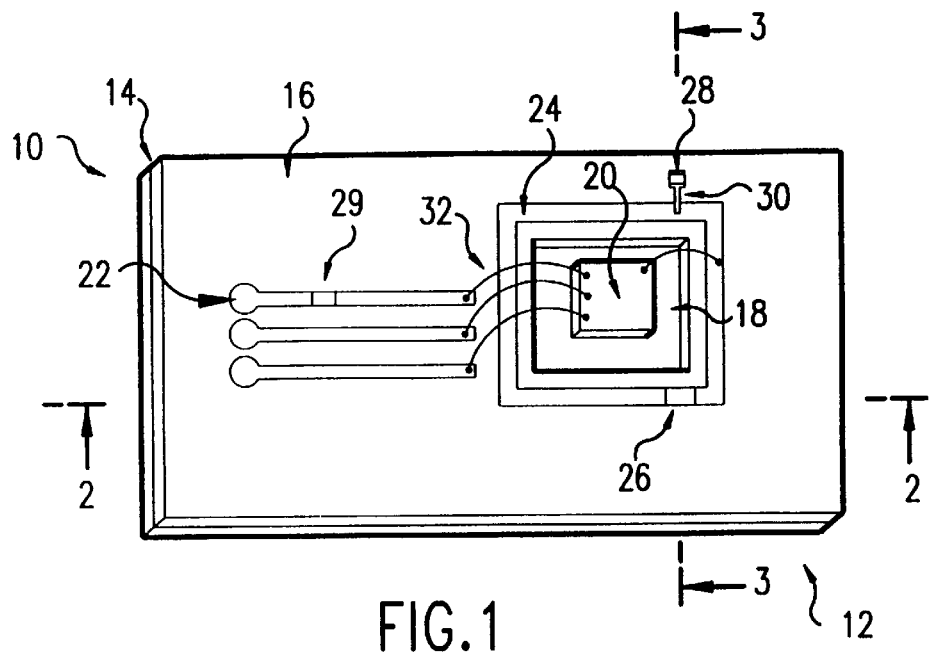
FIG. 1 is an illustration of the invention according to a preferred embodiment.

The exemplary embodiment of the semiconductor package of the present invention is shown in FIG. 1 and is designated generally by the reference numeral 10. As embodied herein and referring to FIG. 1, a semiconductor package 10 includes a rigid metal substrate 12; a dielectric layer 14; a first portion of the metal substrate 16; a second portion of the metal substrate 18; a semiconductor device 20; metal circuit traces 22; a metal ground ring 24; a ground ring via 26; an external ground ring via 28, and a via circuit trace 30.

Dielectric layer 14 is formed on rigid metal substrate 12 and covers a first portion of the metal substrate 16. A second portion of the rigid metal substrate 18 is substantially free of the dielectric layer. A semiconductor device 20 is electrically bonded to second portion of the rigid metal substrate 18.

A continuous metal ring on dielectric layer 14 surrounds the second portion of the metal substrate 18 where semiconductor device 20 is bonded to rigid metal substrate 12. Alternatively, metal ground ring 24 may be comprised of a plurality of segments. At various locations around ground ring 24 may be located ground ring vias 26. Ground ring vias 26 electrically connect ground ring 24 to rigid metal substrate 12. Preferably, ground ring vias 26 connect ground ring 24 directly to rigid metal substrate 12. Generally, rigid metal substrate 12 is connected to ground. Alternatively or additionally, an external ground ring via 28 may be positioned outside, or external, ground ring 24 in the dielectric layer 14 over first portion of the rigid metal substrate 16 to provide a connection from ground ring 24 to rigid metal substrate 12. In this alternative or addition, a metal via circuit trace 30 connects external ground ring via 28 to ground ring 24 to provide electrical connection between ground ring 24 and rigid metal substrate 12. In another alternative or addition, an external via 29, connects any of traces 22 to rigid metal substrate 16 to provide a connection from circuit trace 22 to rigid metal substrate 16. External via 29 may be located anywhere in first portion of rigid metal substrate 16. It is also envisioned that a plurality of ground ring vias 26 may be employed, a plurality of external ground ring vias 28 may be employed, or a plurality of external vias 29 may be employed, as well as any combination of the three, or exclusion of one or two.

Both the ground ring vias 28 and the external vias may be made electrically conductive by any suitable means. Such means include extending circuit trace 30 along the via sidewalls 40. The circuit traces are deposited by such processes as metal sputtering, chemical deposition (both electrolytic and electroless), direct writing of a metal paste and screen printing.

Alternatively, the via is filled with a conductive material such as a conductive polymer, a silver filled epoxy is exemplary. Or, a low melting temperature solder, such as a tin alloy is deposited into the via and heated to a temperature sufficient to melt the solder and cause the solder to reflow. To prevent damage to the other components, it is preferred to employ a solder with a melting temperature below 350° C. and preferably, with a melting temperature below about 300° C.

Located on dielectric layer 14 are metal circuit traces defining electrical paths. Ground ring 24 may be considered such a metal circuit trace. Metal circuit traces 22 are located on dielectric layer 14 over first portion of rigid metal substrate 16 outside metal ground ring 24. In defining an inside and outside of ground ring 24, semiconductor chip 20 is considered to be on the inside of ground ring 24. Wires 32 connect portions of semiconductor chip 20 to selected metal circuit traces 22. Wire 32 connects a portion of semiconductor device 20 to ground ring 24.

As herein preferred, rigid metal substrate 12 has a yield strength from about 17 ksi to 29 ksi, preferably a yield strength from about 22 ksi to 27 ksi. More preferably, rigid metal substrate 12 has a yield strength from about 24 ksi to 29 ksi. As preferred, rigid metal substrate is aluminum, but may also be any of the 5000 series aluminum alloys of the ASM (aluminum alloys including manganese). One preferred alloy is 5086 (nominal composition by magnesium 4%, manganese 0.4% and 0.15% chromium). As herein preferred, rigid metal substrate 12 has a thickness from about 10 mils to 200 mils, preferably a thickness from about 20 mils to 100 mils. More preferably, rigid metal substrate 12 has a thickness from about 23 mils to about 55 mils. Alternatively, rigid metal substrate 12 could be comprised of metal clads including aluminum-silicon carbide, aluminum-copper-aluminum, or copper-molybdenum-copper.

As preferred, dielectric layer 14 is anodized aluminum. Dielectric layer 14 could also be aluminum oxide coated with a polymer, such polymer being, for example, an epoxy, but may also be an epoxy, or a polyimide such as benzo-cyclo-butene, or nitrides such as silver nitride or aluminum nitride, polyether sulfone, or PFE. As herein preferred, dielectric layer 14 has a thickness from about 3 microns to 100 microns, preferably a thickness from about 5 microns to about 50 microns. More preferably, dielectric layer 14 has a thickness from about 10 to about 25. Of course, any layer that provides substantial dielectric properties could also be used.

Semiconductor device 20 is any type of semiconductor device which may or may not have an active layer and a substrate layer. In any event, the layer substantially free of active devices of semiconductor device 20 is electrically bonded to rigid metal substrate 12 on second portion of rigid metal substrate 18. The thermally conductive adhesive (not shown) can be of any type that provides bonding between semiconductor device 20 and the rigid metal substrate 12. As herein preferred, this adhesive is a silver filled epoxy. Alternatively, the adhesive may be silver filled silicone silver filled thermoplastic, graphite diamond, other filled epoxies, or any adhesive of a conductively compliant type. Generally, the adhesive should provide a tensile adhesion of at least about 66 psi.

Ground ring 24 is a continuous metal circuit trace which sits over first portion of rigid metal substrate 16 on dielectric layer 14 and surrounds the cavity defined by second portion of metal substrate 18. Alternatively, ground ring may be segmented. Ground ring 24 is set back from the edge of second portion a minimum of 4 mils. Preferably, this distance is 10 mils, more preferably, this distance is from about 8 to about 12 mils. The width of the ground ring 24 is from about 5 mils to about 35 mils, preferably it is from about 7 mils to about 25 mils, more preferably is from about 10 mils to about 20 mils.

Alternatively, ground ring 24 may or may not be connected to any fixed potential or rigid metal substrate 12.

Metal circuit traces 22 are offset from ground ring 24 approximately a distance from about 5 mils to about 20 mils, preferably it is from about 7 to about 15 mils, more preferably it is from about 3 mils to about 7 mils. The width of the metal circuit traces 22 is from about 0.5 mils from about 4.5 mils. The width of metal circuit traces is generally design dependent. Generally, connections outside semiconductor package 10 are made to circuit traces 22.

Metal circuit traces including ground ring 24 and metal circuit traces 22 as herein embodied as layered chromium, copper, nickel and gold. Chromium acts as a glue layer between dielectric layer 14 and a conductive layer of copper. A layer of nickel is formed over the copper layer to prevent the copper from migrating upward. A layer of gold is formed over the nickel to prevent oxidation. However, any combination of metals copper, nickel, and gold, including the absence of one or two, is also preferred. Directly underneath any metal circuit traces may be a glue layer (not shown). This glue layer may be chromium, tantalum, titanium, nickel-chromium, or any other metal-glue layer. Any such metal that may be plated, deposited, or otherwise formed on dielectric layer 14 may be used for the metal circuit traces. In general, the thickness of such metal circuit traces is from about 1.5 microns to about 15 microns, preferably it is from about 3 microns to about 9 microns, more preferably, it is from about 4 microns to about 7 microns.

Wires 30 and 32 connect semiconductor 20 to metal circuit traces including metal ground ring 24 and metal circuit traces 22. Wires 30 and 32 are typically ultrasonically or thermocompressively bonded, or thermosonic or TAB bonded to both the metal circuit traces and pads (not shown) on semiconductor device 20.

Alternatively, semiconductor device 20 could be TAB bonded or bonded as a flip-chip.

Figure 2:
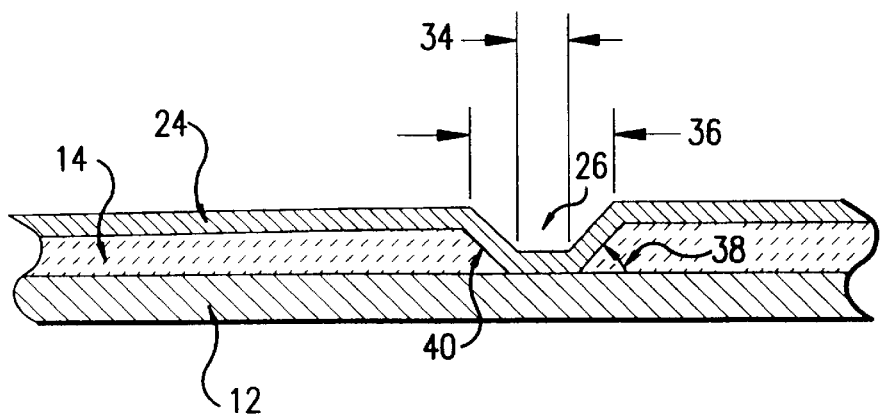
FIG. 2 is a cross-section along line B—B' of the illustration in FIG. 1.

Explanation will now be given to vias 26, 28, 29 made through dielectric layer 14 using FIGS. 2 and 3. FIG. 2 illustrates a cross-section of FIG. 1 along a line B—B' showing a side view of a typical via. As illustrated in FIG. 2, ground ring via 26 provides a location for ground ring 24 to contact with rigid metal substrate 12 in an area substantially free of dielectric layer 14.

A typical via includes an internal distance 34; an external distance 36; angle 38; and sloping sides 40. Sloping sides 40 make an angle 38 with a top edge of rigid metal substrate 12. Angle 38 is from about 10 to 53 degrees. Preferably, angle 38 is from about 30 to 53 degrees, more preferably, angle 38 is from about 40 to 50 degrees. If angle 38 is too steep incomplete metallization might occur resulting in areas of high stress which might lead to cracking. If angle 38 is too shallow, too much area is occupied by the vias resulting in a loss of device area.

Internal distance 34 is a distance from where one of sloping sides 40 meets rigid metal substrate 12 to where the other of sloping sides 40 meets rigid metal substrate 12. Typically internal distance 34 is about 1 mils to about 10 mils. Preferably, internal distance 34 is from about 0.5 mils to about 8 mils, more preferably, internal distance 34 is from about 0.5 to about 1 mils.

External distance 36 is a distance from where one of sloping sides 40 meets a top edge of dielectric layer 14 to where the other of sloping sides 40 meets dielectric layer 14. Typically external distance 36 is from about 1 mils to about 10 mils. Preferably, external distance 36 is from about 2 mils to about 2.6 mils, more preferably, external distance 36 is from about 2.6 mils.

Alternatively, vias 26, 28, and 29 could be circular instead of rectangular, thus forming a cavity in the shape of an upside cone. In this instance, internal distance 34 is about 1 mils to about 30 mils. Preferably, internal distance 34 is from about 8 mils to about 20 mils, more preferably, internal distance 34 is from about 10 to about 15 mils. If internal distance 34 is too small, an incomplete connection between circuit traces 22 and rigid metal substrate 12 will result.

Figure 3:
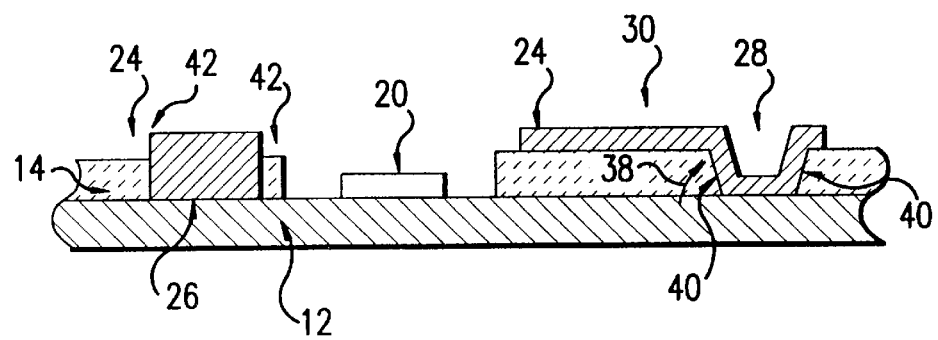
FIG. 3 is a cross-section along line A—A' of the illustration of FIG. 1.

FIG. 3 provides an illustration of FIG. 1 along a line drawn from A—A'. As can be seen in this Figure, it shows an end view of ground ring via 26 of FIG. 2. Ground ring via 26 has only two sloping sides 40, the other two sides 42 are substantially vertical. Alternately, vias 26, 28, and 29 could have all four side sloping, or have one circular side.

FIG. 3 also illustrates a side view of external ground ring via 28 showing sloping sides 40 of external ground ring via 28. FIG. 3 also illustrates a portion of ground ring 24, external ground ring via 28 and via circuit trace 30. As can be seen in FIG. 3, this view of external ground ring via 28 includes sloping sides 40 which have an angle 38 similar to those of via 26. Circuit trace 30 provides an electrical connection from ground ring metal 24 to via 28 and via 28 provides electrical contact to rigid metal substrate 12. External via 29 may be located in metal circuit traces 22 as illustrated in FIG. 3. Alternatively, external via 29 may be located anywhere in first portion of rigid metal substrate 12. It may or may not then be connected to metal circuit traces 22 and ground ring 24.

In another preferred embodiment, only one side of vias 26, 28, and 29 is sloped. Alternatively, two, three, or all four of the sides may be sloped.

In a preferred method of manufacturing an electronic package 10, rigid metal substrate 12 is coated with dielectric layer 14. This coating may be either by deposition, anodization, chemical conversion, or lamination. The dielectric layer 14 initially covers all of rigid metal substrate 12. A mask is placed over rigid metal substrate 12 and dielectric layer 14 to selectively etch away the dielectric layer 14 from second portion of the metal substrate 18, leaving dielectric layer 14 intact over the first portion of the metal substrate 16. Such a technique may be by dry etching, wet etching, and other well known removal methods and accomplished by well-known techniques of positive photoresist masking or negative photoresist masking, or by placing a mechanical template over the top of dielectric layer 14 and then removing portions of dielectric 14 over the second portion of the metal substrate 18, or by machining. Alternatively, dielectric layer 14 may be created by mask and subsequent etch or mask and subsequent anodization.

In making the vias 26, 28, and 29 care must be taken to meet the following criteria: (1) sloping sides 40 should preferably be smooth and have no sharp corners where stress concentrations might develop; (2) the surface of rigid metal substrate 12 should preferably have perfect electrical contact; (3) the walls should be preferably sharp and well defined allowing vias to be located close to metal circuit traces; and (4) the surrounding dielectric layer 14 around the via should preferably remain unaffected by the process used to create the vias and contain minimal or no slag residues. Accordingly, vias 26 and 28 are created by applying a laser over the areas where the vias are to be placed. The laser may be an excimer, YAG, Xenon, or $CO_2$ laser. Alternatively, vias 26, 28, and 29 could be created during the forming of dielectric layer 16 by mask and subsequent etch or by mask and subsequent anodization. Still another alternative is to use a mask to etch away portions of dielectric layer 16 to create vias 26, 28, and 29.

Figure 4:
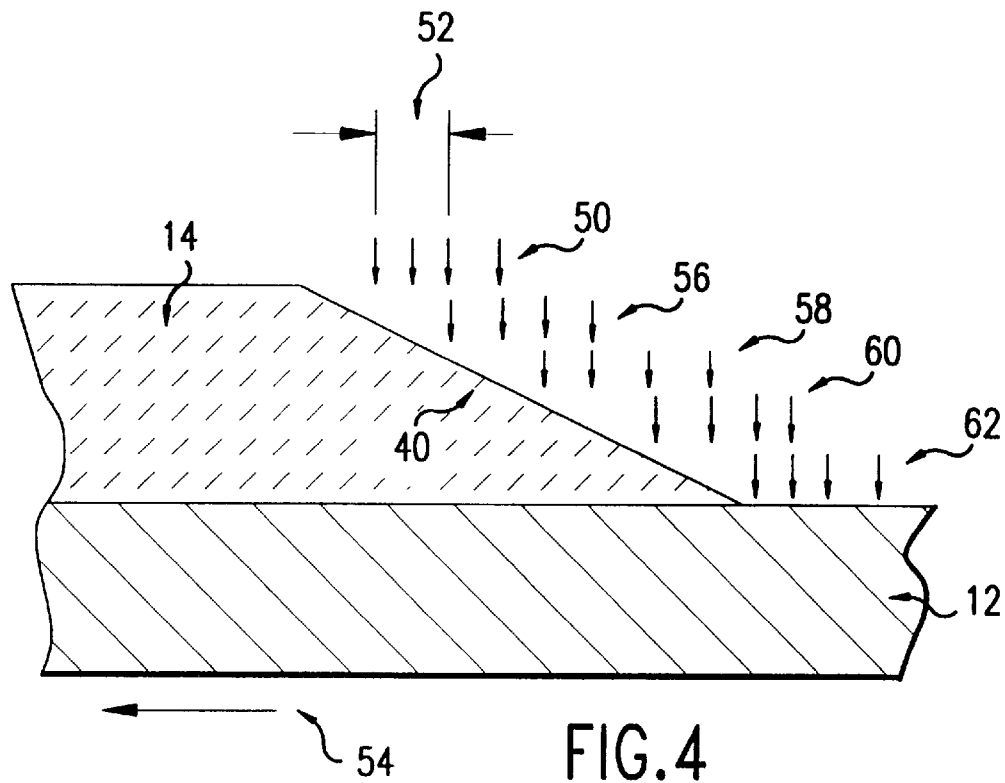
FIG. 4 is an illustration of a via in accordance with the invention.

In one embodiment, dielectric layer 14 is exposed to a laser image in incremental sets of overlapping laser pulses so that as dielectric layer 14 moves in a direction under the laser pulses a deeper amount of dielectric layer 14 is removed. For example, as illustrated in FIG. 4, a set of four laser pulses forming laser pulse image 50 is applied to dielectric layer 14. Dielectric layer 14 is then moved a step size distance 52 in a direction 54. The four lasers are pulsed again in laser pulse image 56. Subsequent moves in direction 54 of step size distance 52 and laser pulse images are illustrated for laser pulse images 58, 60, and 62. Although illustrated as a pulse image of four lasers and a sequence of five pulse images, this is for illustration purposes only.

A shorter step size distance 52 results in a smoother side 40.

In another preferred embodiment, dielectric layer 14 is exposed to a continuous laser pulse. Moreover, another preferred embodiment envisions the number of lasers as a design choice.

A preferred operating characteristic is a laser with a fluence from about 5 to about 30 $J/cm^2$, a laser pulse rate from about 5 to about 150 Hz, and a scan rate from about 0.2 to about 8 mm/sec. More preferably, a fluence from about 8 to about 20 $J/cm^2$, a laser pulse rate from about 50 to about 150 Hz, and a scan rate from about 0.25 to about 8 mm/sec.

Another preferred operating characteristic for an excimer laser is a scan rate of about 10 to about 300 mils per sec (about 0.25 to about 7.6 mm/sec); a pulse rate from about 50 to about 150 Hz, and a fluence of about 8 $J/cm^2$. A preferred operating characteristic for a $CO_2$ laser is a pulse rate of about 150 Hz and a fluence of about 14 $J/cm^2$.

In still another preferred embodiment, vias 26, 28, and 29 are produced by a laser defocusing method. In this method, the shape of the via is achieved by using a mask between the laser and the target, for example, dielectric layer 14. The tapered, or sloping, walls of the via are created by the out of focus image. At the edge of the unfocused image on the target the laser fluence is minimum resulting in less penetration of the target. Laser fluence, typically decreases from the center of the unfocused image to a distance from the edge of the target.

Figure 5:
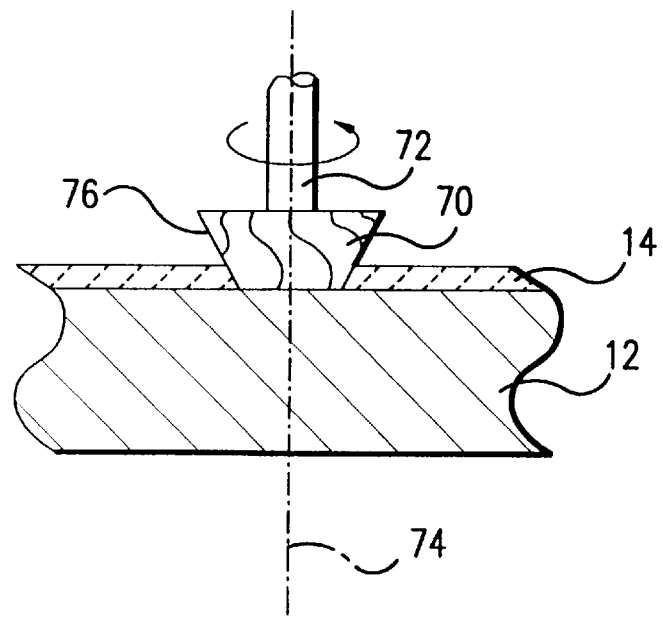
FIG. 5 illustrates in cross sectional representation a mechanical method to form a via.

Alternatively, as illustrated in FIG. 5, the vias are formed by a mechanical process such as milling. A tool 70 having a surface texture and hardness effective to remove the dielectric layer 14 is contacted to the dielectrictric layer 14 and actuated such as by rotation about shaft 72. Shaft 72 rotates about an axis 74 that is generally perpendicular to the surface of the rigid metal substrate 12. Sidewalls 76 of the tools 70 are sloped relative to the surface of the rigid metal substrate generating via sidewalls of the desired angles described above.

After the vias have been made, metal ground ring 24 and metal circuit traces 22 are then formed either by screen printing, vapor deposition, or by any other well-known technique for depositing metal or forming on the dielectric layer.

Wires 30, 32 are then connected from semiconductor device 20 to metal circuit traces 22 or ground ring 24.

An electronic package according to the above described description creates a ground plane below not only the chip and wires 30, but the circuit traces over rigid metal substrate 12 as well. By itself, the ground plane of rigid metal substrate 12 provide less noise, cross-talk, inductive coupling, capacitive coupling, self inductance, and mutual inductance. In addition, metal ground ring 24, electrically connected to rigid metal substrate 12, provides further reduction in noise, cross-talk, electromagnetic interference (EMI), inductive coupling, capacitive coupling, self inductance, and mutual inductance, as well as providing a controlled impedance environment. An additional, further reduction results from coupling the ground portion of the semiconductor device 20 to ground ring 24. The resulting semiconductor package provides a uniform ground potential between the semiconductor device 20, rigid metal substrate 12, to which semiconductor device 20 is electronically bonded, and ground ring 24.

Lower coupling capacitance is provided by having rigid metal substrate 12 connected as a conductive plane (i.e., connect to ground or power). The electric field lines present above rigid metal substrate 12 from circuit traces 22 terminate at rigid metal substrate 12 because it is a conductive plane resulting in less electrostatic coupling between circuit traces 22.

Lower self inductance and lower mutual inductance is a function of interconnect geometry and any distance from a conductive plane. The presence of a conductive plane, for example, rigid metal substrate 12, reduces a current loop in the conductor. A reduced current loop produces lower inductance. Additionally, a current flowing through metal circuit traces 22 creates an image current on rigid metal substrate 12 in a direction opposite to the current in metal circuit traces 22. These opposing magnetic flux lines cancel each other resulting in a lower self inductance and coupling inductance between circuit traces 22.

Controlled impedance is provided by having rigid metal substrate 12 at a single voltage reference. Each of the circuit traces 22 "see" one reference voltage at the rigid metal substrate 12.

Although described as connected to ground and as metal ground ring 24, in another preferred embodiment, rigid metal substrate 12 could alternatively be connected to power. In still another preferred embodiment, rigid metal substrate 12 and ground ring 24 are not connected and may or may not be connected to different potentials. For example, rigid metal substrate 12 may be connected to ground through an external via 29 and ground ring 24 may connected to a potential associated with a particular circuit trace 22 which may or may not be the same as ground.

It will be apparent to those skilled in the art that various modifications and variations made in the electronic package of the present invention without departing from the spirit or scope of the invention, thus, it is intended that the present invention cover the modifications and variations of this invention provided that they come within the scope of the appended claims and their equivalents.

We claim:

1. A semiconductor package comprising:
   (a) a rigid metal substrate;
   (b) a dielectric layer covering a first portion of the rigid metal substrate, a second portion of the rigid metal substrate being substantially free of the dielectric layer;
   (c) a semiconductor device both electrically interconnected and physically bonded to the second portion of the rigid metal substrate; and
   (d) metal circuit traces defining electrical paths on the dielectric layer, at least one of which is electrically connected to the rigid metal substrate through at least one via in the dielectric layer, said via having at least one side sloping at an angle of from about 35 to about 53 degrees as measured from the rigid metal substrate.

2. A semiconductor package according to claim 1, wherein the rigid metal substrate is connected to ground.

3. A semiconductor package according to claim 1, wherein the rigid metal substrate is connected to power.

4. A semiconductor package according to claim 1, wherein the metal substrate is aluminum.

5. A semiconductor package according to claim 4, wherein the dielectric layer is comprised of an aluminum oxide layer and a polymer layer.

6. A semiconductor package according to claim 4, wherein the dielectric layer is aluminum oxide.

7. A semiconductor package according to claim 6, wherein the dielectric layer is anodized aluminum.

8. A semiconductor package according to claim 7, wherein the angle is from about 40 to 50 degrees.

9. A semiconductor package according to claim 1, wherein the via is inwardly conical toward the rigid metal substrate and makes and angle from about 40 to 50 degrees as measured from the rigid metal substrate.

* * * * *